US006820321B2

(12) United States Patent
Harding

(10) Patent No.: US 6,820,321 B2
(45) Date of Patent: Nov. 23, 2004

(54) METHOD OF MAKING ELECTRONIC TRANSFORMER/INDUCTOR DEVICES

(75) Inventor: Philip A. Harding, Palos Verdes, CA (US)

(73) Assignee: M-Flex Multi-Fineline Electronix, Inc., Anaheim, CA (US)

( * ) Notice: Subject to any disclaimer, the term of this patent is extended or adjusted under 35 U.S.C. 154(b) by 29 days.

(21) Appl. No.: 09/961,789

(22) Filed: Sep. 24, 2001

(65) Prior Publication Data

US 2002/0070831 A1 Jun. 13, 2002

Related U.S. Application Data

(60) Provisional application No. 60/234,636, filed on Sep. 22, 2000, and provisional application No. 60/237,356, filed on Sep. 27, 2000.

(51) Int. Cl.⁷ .............................................. H01F 7/127
(52) U.S. Cl. .......................... 29/602.1; 29/606; 29/607; 29/852; 29/DIG. 16; 216/22; 336/200; 336/222
(58) Field of Search .......................... 29/847, DIG. 16, 29/602.1, 604, 606, 607, 846, 852; 216/22; 336/200, 205, 220, 222, 229

(56) References Cited

U.S. PATENT DOCUMENTS

| | | | |
|---|---|---|---|
| 3,684,991 A | | 8/1972 | Trump et al. |
| 4,383,235 A | | 5/1983 | Layton et al. |
| 4,800,461 A | * | 1/1989 | Dixon et al. .............. 29/852 X |
| 5,070,317 A | | 12/1991 | Bhagat |
| 5,126,714 A | | 6/1992 | Johnson |
| 5,257,000 A | | 10/1993 | Billings et al. |

(List continued on next page.)

FOREIGN PATENT DOCUMENTS

| | | | |
|---|---|---|---|
| CN | 193769 | 11/1992 | |
| EP | 0 033 441 A1 | 8/1981 | |
| EP | 0 262 329 A1 | 4/1988 | |
| EP | 0 756 298 A2 | 1/1997 | |
| JP | 55-110009 | * 8/1980 | ................. 336/200 |
| TW | 432412 | 5/2001 | |

OTHER PUBLICATIONS

Moulder et al, "Inductance of a Coil on a Thick Ferromagnetic Metal Plate", IEEE Transactions on Magnetics, vol. 34, No. 2, Mar. 1998, pp. 505–514.*
Philip A. Harding; Copending U.S. patent application entitled Slot Core Transformers; application Ser. No. 09/863,028, Filed: May 21, 2001.

*Primary Examiner*—A. Dexter Tugbang
(74) *Attorney, Agent, or Firm*—Knobbe, Martens, Olson & Bear, LLP

(57) ABSTRACT

Methods of construction for inductive components such as inductors, chokes, and transformers enable these components to be fabricated using mass production techniques, thereby avoiding the need to handle discrete devices during the manufacturing process. In one preferred embodiment, holes are formed through a ferromagnetic substrate and plated with conductive material. The arrangement of these holes, and the subsequent design that ensues, will form the inductive components within the plane of the media in which the device is formed; using the substrate for a magnetic core. By using this approach, the inductive components can be miniaturized to physical sizes compatible with the requirements of modern surface mount technology (SMT) for integrated circuitry (IC). In another preferred embodiment, a series of thin, concentric high permeability rings are etched on a substrate to provide high permeability transformers and inductors having minimal eddy current effects.

11 Claims, 17 Drawing Sheets

U.S. PATENT DOCUMENTS

| | | |
|---|---|---|
| 5,392,020 A | 2/1995 | Change |
| 5,514,337 A | 5/1996 | Groger et al. |
| 5,532,667 A | 7/1996 | Haertling et al. |
| 5,781,091 A * | 7/1998 | Krone et al. ............... 336/200 |
| 5,877,669 A | 3/1999 | Choi et al. |
| 5,884,990 A * | 3/1999 | Burghartz et al. .......... 336/200 |
| 6,040,753 A | 3/2000 | Ramakrishnan et al. |
| 6,073,339 A * | 6/2000 | Levin .......................... 29/606 |
| 6,148,500 A | 11/2000 | Krone et al. |
| 6,262,463 B1 | 7/2001 | Miu et al. |

\* cited by examiner

FIG. 5
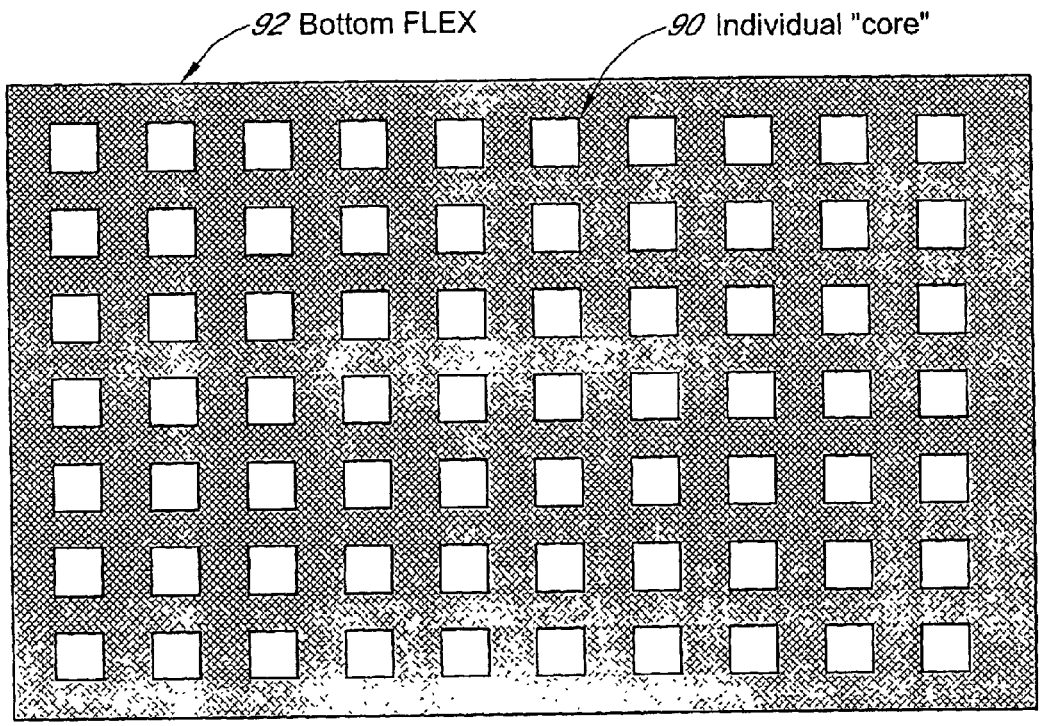
Array of 70 cores laminated onto a large panel of FLEX
(top FLEX removed to show the individual cores)
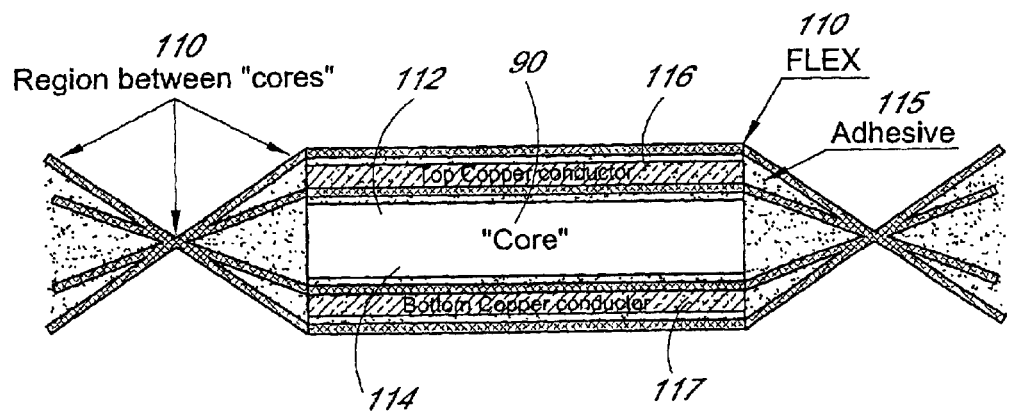
Side view showing top & bottom FLEX laminated to "core" in a panel of 70 "cores"
FIG. 6

Side view showing top & bottom PCB laminated to "core" in a panel of 25 "cores"

Cross section of via hole of "core" with screened conductive paste

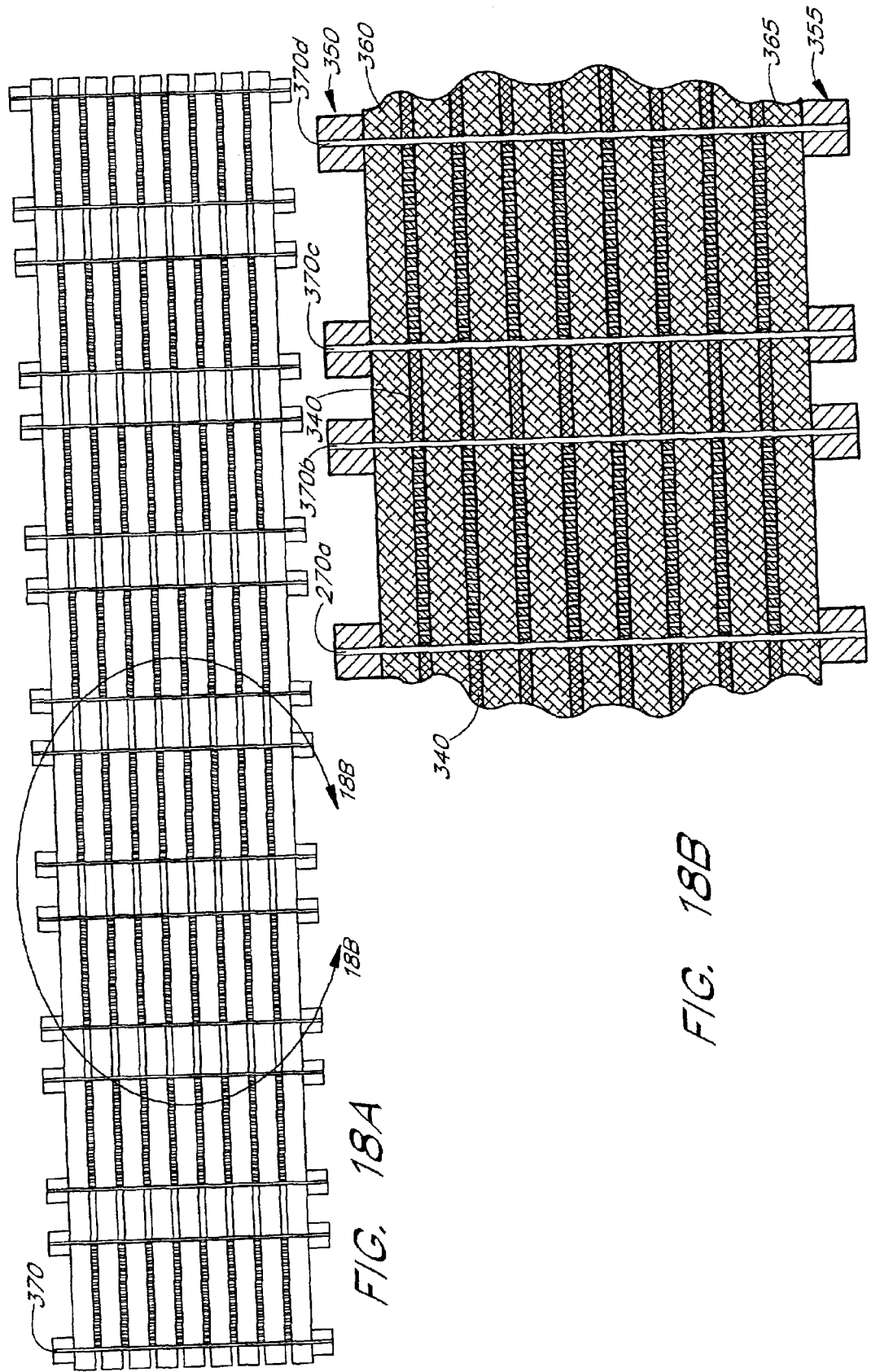

METHOD OF MAKING ELECTRONIC TRANSFORMER/INDUCTOR DEVICES

PRIORITY CLAIM

This application claims the benefit of U.S. Provisional Application No. 60/234,636 filed Sep. 22, 2000 entitled "Electronic Transformer/Inductor Devices And Methods For Making Same" and U.S. Provisional Application Ser. No. 60/237,356 filed Sep. 27, 2000 entitled "Electronic Transformer/Inductor Devices And Methods For Making Same."

FIELD OF THE INVENTION

The present invention relates to inductive components and methods for manufacturing these components.

BACKGROUND OF THE INVENTION

Inductive components are commonly fabricated using ferromagnetic cores and windings of insulated electrical wire. The ferromagnetic cores are typically toroidal cores, rod cores, or assemblies made of a lower E shaped ferromagnetic part and a ferromagnetic cap connecting the three legs of the E such as shown in FIG. 1.

The toroid and rod cores are manually or automatically wound with the insulated copper wire to form a number of multiple turn windings for a transformer or a single winding for an inductor. The assembly is then typically encapsulated to protect the wires. The circuit connection is made by the solder termination of the wires as required by the application. This approach has high labor costs because of individual part handling. It has large variability in electronic parameters such as leakage inductance, distributed and interwinding capacitance, and common mode imbalance between windings because of the difficulty in exact placement of the copper wires.

The E shaped and encompassing cap assembly of FIG. 1 is made into an inductive component by manually or automatically winding copper insulated wires around the legs of the E as required. Either gluing or clamping the cap in place and final encapsulation completes this subassembly. Similarly, the circuit connection is made by means of solder termination of the wires as required by the application. Not only does this device have the limitations of the toroid and rod core, as mentioned above, but also it generally is a much larger device. Because the cap is a separate device the magnetic paths have a resistance of non-ferromagnetic gaps between the E and the cap reducing the efficiency of the transformer.

Power transformers constructed as shown in FIG. 1 have the further disadvantage that the heat resulting from the resistance losses in the windings is not easily dissipated because the E core and cap isolate these windings from a heat sink.

SUMMARY OF THE INVENTION

The preferred embodiments of the present invention provide inductors and transformers and methods of manufacturing these devices which offer very significant advantages over the state-of-the-art. These inductors and transformers connected in accordance with this invention have a number of applications in the electronics, telecommunication and computer fields. In one preferred embodiment described below, a rectangular slab of ferromagnetic material is encapsulated between printed circuitry. A plurality of through holes (vias) are drilled through or formed during manufacture of the slab from the top face of the slab to the bottom face of the slab, the number of holes corresponding to the number of desired turns of the windings. This embodiment utilizes Ampere's Law in a very novel manner to form a transformer, inductor, or the like within the circuit board rather than the use or assembly of discrete inductive devices to the circuit board. Thus, the windings are not insulated electric wires. Rather, the holes through the slab are made electrically conductive by through hole plating or the like and electrically connect with the printed circuits encapsulating the slab. This pattern of plated through holes and the printed circuitry form the inductor and transformer windings with the core of the inductors and transformers being the drilled or formed slab of ferromagnetic material. This embodiment provides substantial improvements, particularly in fabricating high frequency inductors and transformers.

In another preferred embodiment described below, the core of the inductors or transformers comprises cores formed by a multi-layer series of thin concentric ferromagnetic metal rings supported on a suitable substrate such as a flex circuit (FLEX) or printed circuit board (PCB). Through holes proximate these concentric ring cores provide electrical connection with printed circuitry to provide the inductor and transformer windings. This embodiment enables construction of high permeability inductors and transformers having minimal eddy current effects. Inductors and transformers so constructed have particular application for miniature low frequency power supplies.

In addition to the advantages described above, the preferred embodiments have a number of additional significant advantages. These include: superior heat removal, outside connections that are more accessible to simplify electrical connection, shorter flux paths to increase magnetic performance, simpler fabrication, interconnections that are more integrated, smaller inductive devices, superior performance, and excellent manufacturing repeatability.

BRIEF DESCRIPTION OF THE DRAWINGS

Having thus summarized the general nature of the invention and its essential features and advantages, certain preferred embodiments and modifications thereof will become apparent to those skilled in the art from the detailed description herein having reference to the figures that follow, of which:

FIG. 5 shows an array of 70 cores laminated onto a large panel of FLEX with the top FLEX layer removed to show the individual cores;

FIG. 6 is an enlarged side view showing top and bottom FLEX laminated to an individual core slab;

FIG. 18A is a cross-sectional view after plated through via holes have been drilled through the laminated structure of FIG. 17A; and FIG. 18B is an enlarged view of one of the core stacks of FIG. 18A.

DETAILED DESCRIPTION OF THE PREFERRED EMBODIMENT

Figure 2A:
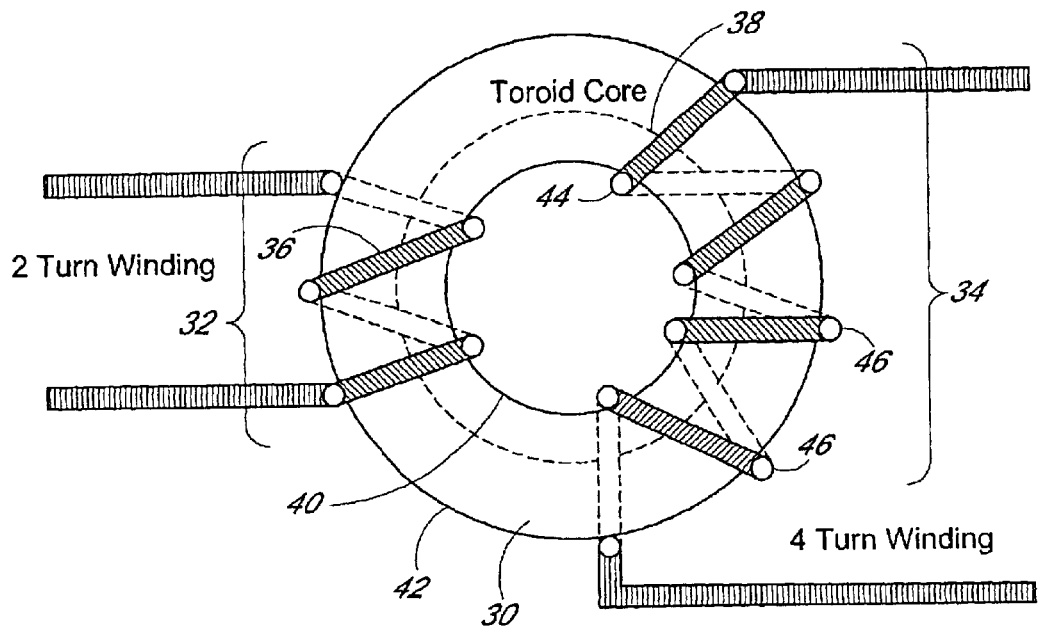
FIG. 2A is a top view of a conventional toroidal transformer.
Figure 2B:
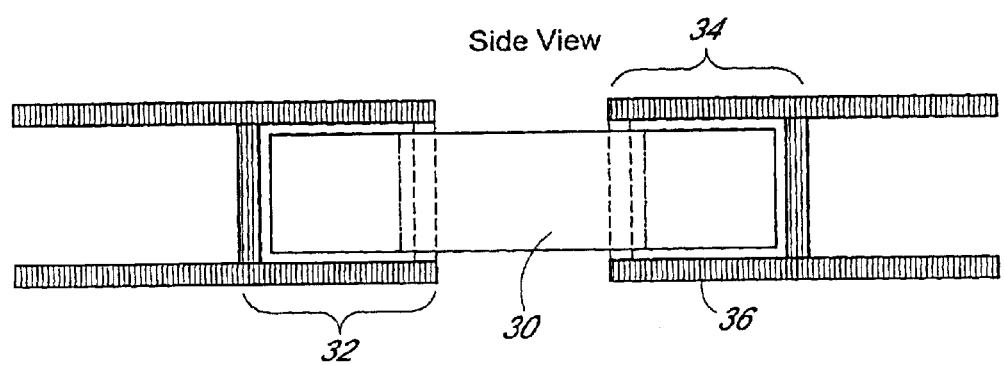
FIG. 2B is a side view of a conventional transformer.

FIG. 2 illustrates a typical prior art transformer with a toroidal core 30. For simplicity this transformer has two windings of insulated wire: a two-turn winding 32 and a four-turn 34 winding. Each turn 36 encircles the material of the core 30 such that when electrical current is passed through one winding an encircling magnetic flux path 38 flows within the core 30. FIG. 2A illustrates the windings 32, 34 passing through the center of the core 30, and around the outside of the core 30.

Preferred embodiments of the present invention have a very different core and winding arrangement. In one of these preferred embodiments shown generally in FIG. 3, slab 50 of ferromagnetic material has a top surface 52 and bottom surface 54, and, shown in cross-sections, two outer holes (vias) 56 and one inner hole (via) 64 within the slab 50. As described below, for miniature inductors and transformers, the slab 50 is advantageously a thin layer of ferrite having a relatively high resistivity.

Figure 3B:
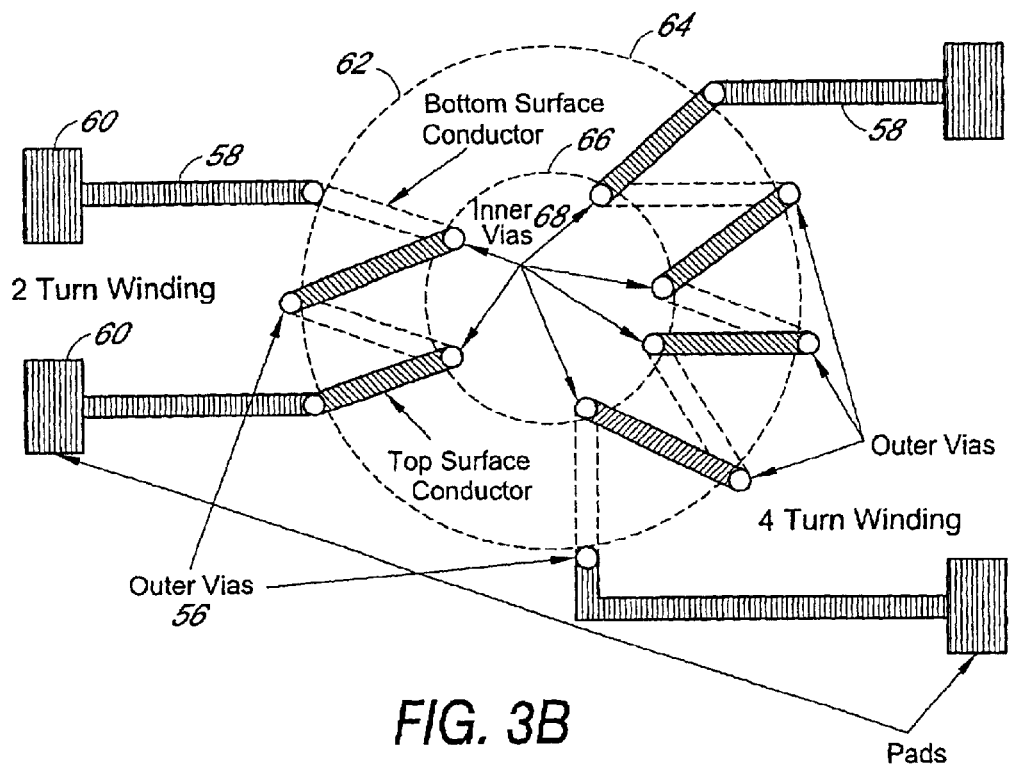
FIG. 3B is a side view of the virtual transformer of FIG. 3.
Figure 3A:
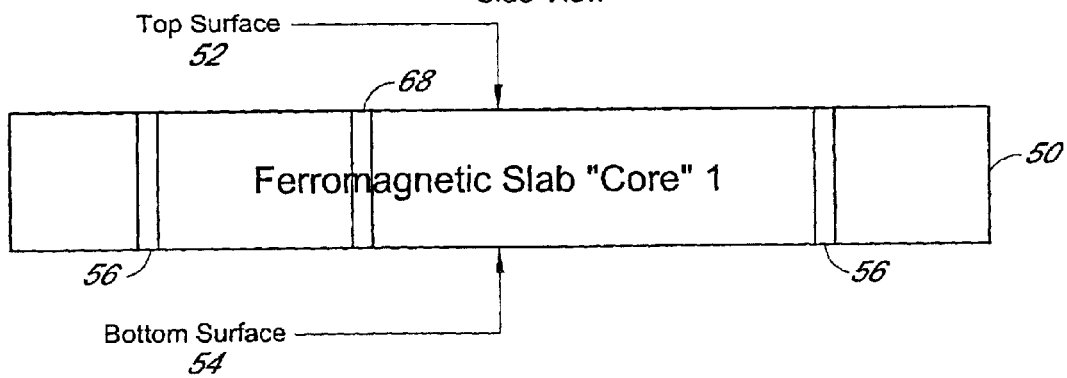
FIG. 3A is a top view of a representation of a "virtual" toroidal transformer.

FIGS. 3A and 3B show a "virtual" toroid transformer constructed in accordance with one of the preferred embodiments of the invention using the slab 50 with eight outer via holes 56 and six inner via holes 68 (not all of which are shown in FIG. 3B). Conductors 58 are formed on the top 52 and bottom 54 surfaces of the slab. The conductors have pads 60 for connection to other devices, or circuitry. As described below, these outer and inner vias 56, 68 are plated through from top to bottom and in electrical contact with the conductor 58 so that a complete electrical circuit extends between, for example, pad 60 and pad 60'. As described below, a virtual toroidal transformer 62 is thus formed having a circular path 62.

Figure 4:
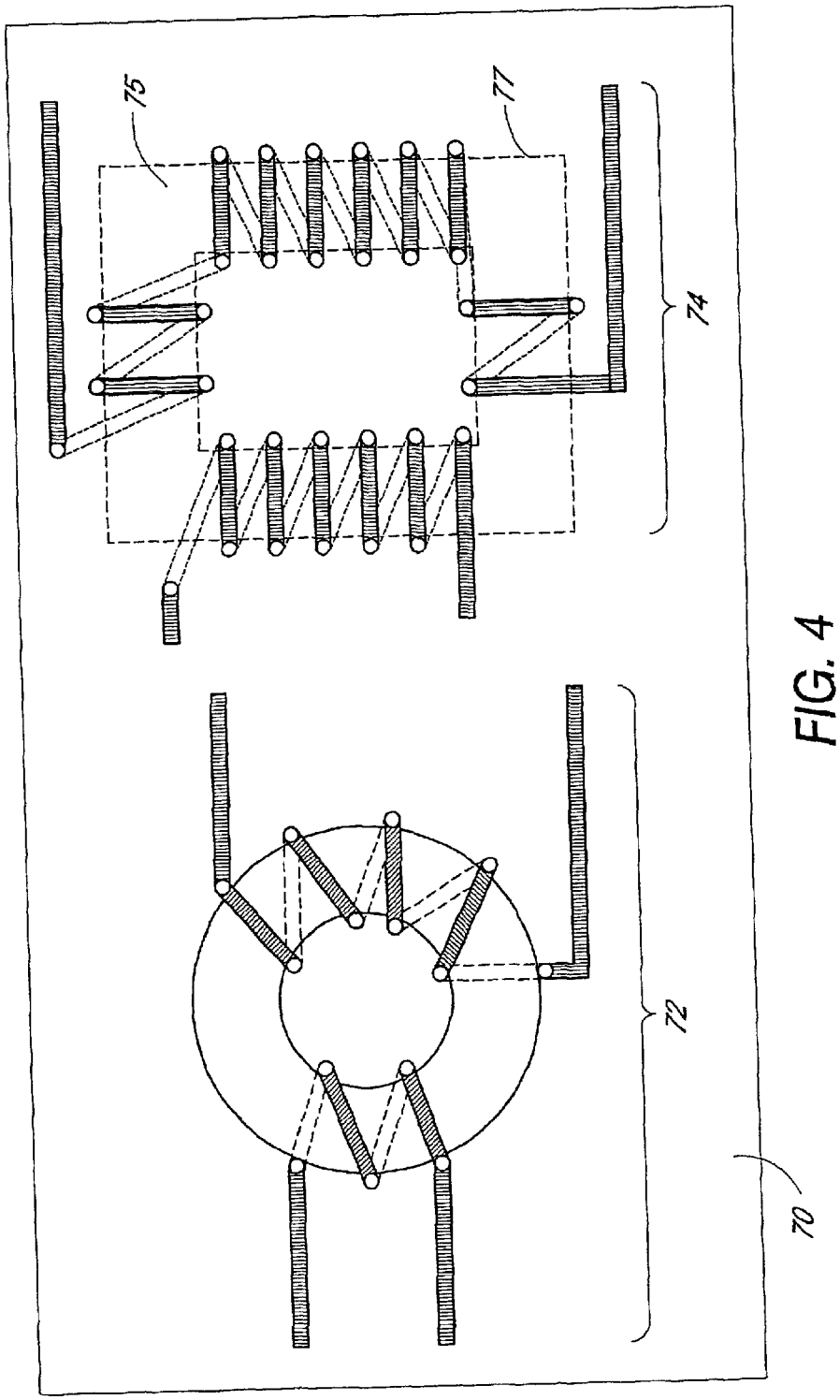
FIG. 4 shows a top view of other preferred embodiments of a virtual transformer.

FIG. 4 illustrates shows a ferromagnetic slab 70 with two independent virtual cores 72, 74 residing on the same slab 70. The second transformer 74 illustrates another embodiment of the invention in which the vias are rearranged in specific patterns. This rearrangement forms a rectangular virtual toroid 75 with an inner rectangle 76 and an outer rectangle 77.

The windings 32, 34 as shown in FIG. 2 are inductively coupled together by way of the core 30. The core 30 provides a magnetic flux path which couples the first winding 32 to the second winding 34 thereby generating an electrical voltage at the second winding when there is a voltage present at the first. This is the basic theory of a transformer, which transforms energy from one winding to another. The major portion of the magnetic flux is constrained between the inner 40 and outer 42 radius of the core.

Ampere's law constrains the flux path independent of the shape of the core; therefore, as discussed in detail below, it is not necessary to actually fabricate the donut shape of the toroid to create devices that behave similarly.

Fabrication as Part of a FLEX

Figure 7:
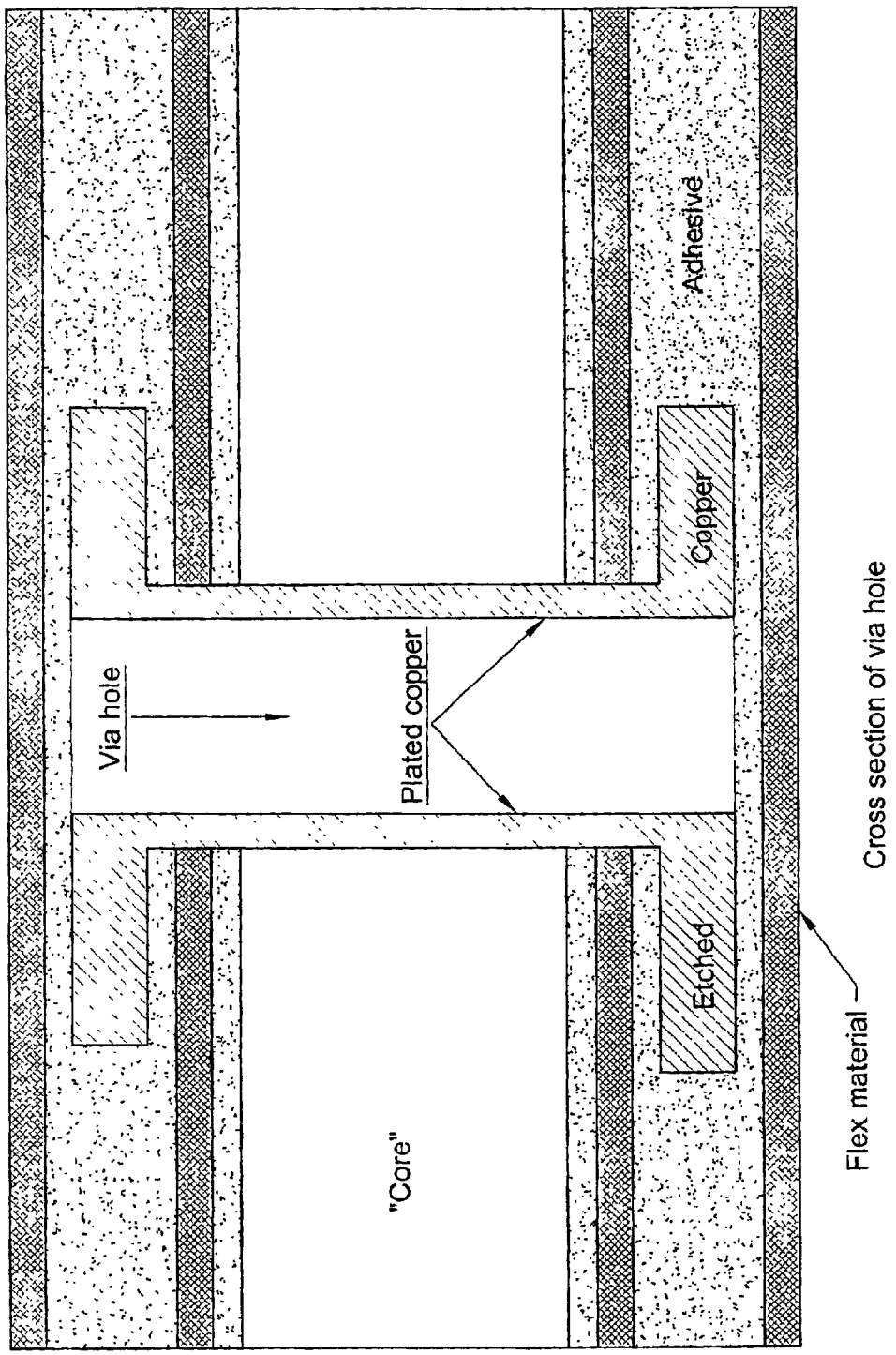
FIG. 7 shows a cross-section of a via hole in an individual slab.

One method of fabrication is to embed a multiplicity of ferromagnetic slabs (cores 90) within the top and bottom layers of FLEX 92 circuits such as shown in FIGS. 5, 6 and 7. Copper circuit patterns 92 corresponding to the desired windings are formed on an epoxy sheets 110 which are glued to the top and bottom surfaces 112, 114 of the slab by adhesive 115. The cores 90 are thus contained in the circuits 92 by a lamination process. Via holes are formed through the composite layers of FLEX 92, and the cores, to form a connection between the top FLEX 116 circuitry to the bottom FLEX 117 circuitry, as illustrated in FIGS. 6 and 7. Filling vias with conductive inks and standard industry plating processes are preferred methods used to make the connections for large numbers of virtual cores simultaneously. The cross section of this construction is shown in FIGS. 6 and 7.

Fabrication as Part of a PCB

Figure 8:
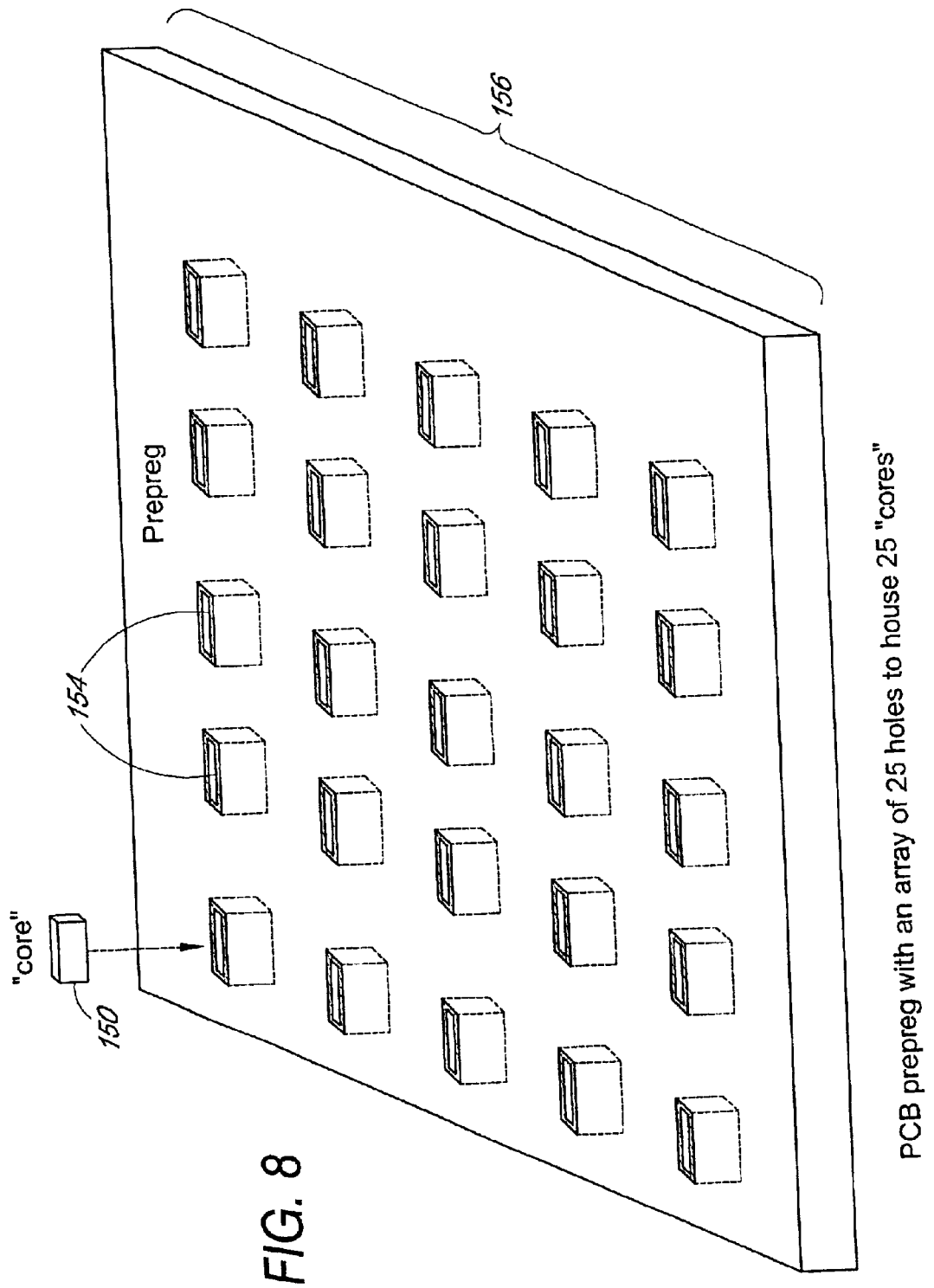
FIG. 8 shows an example of a PCB prepreg with an array of 25 holes to house 25 cores.
Figure 9:
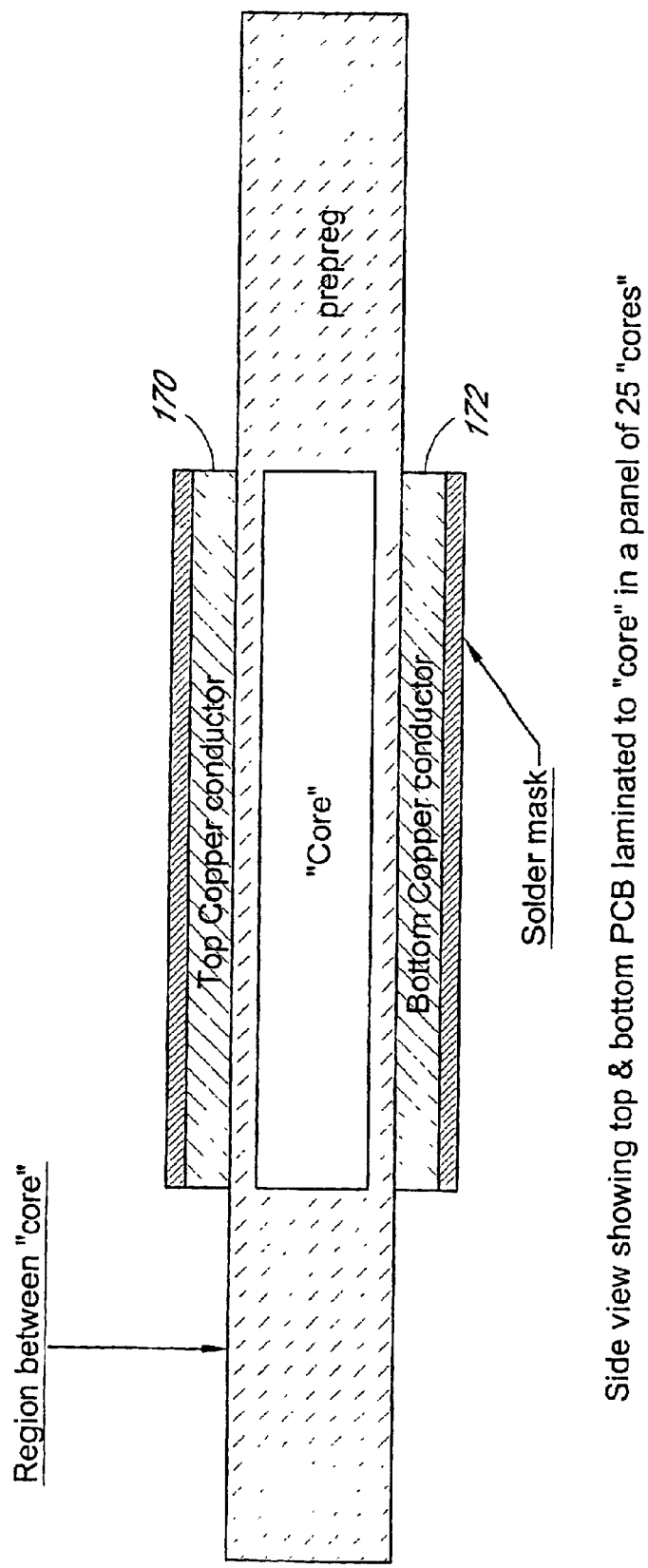
FIG. 9 is an enlarged side view of an individual core showing top and bottom PCB laminated to the core.
Figure 10:
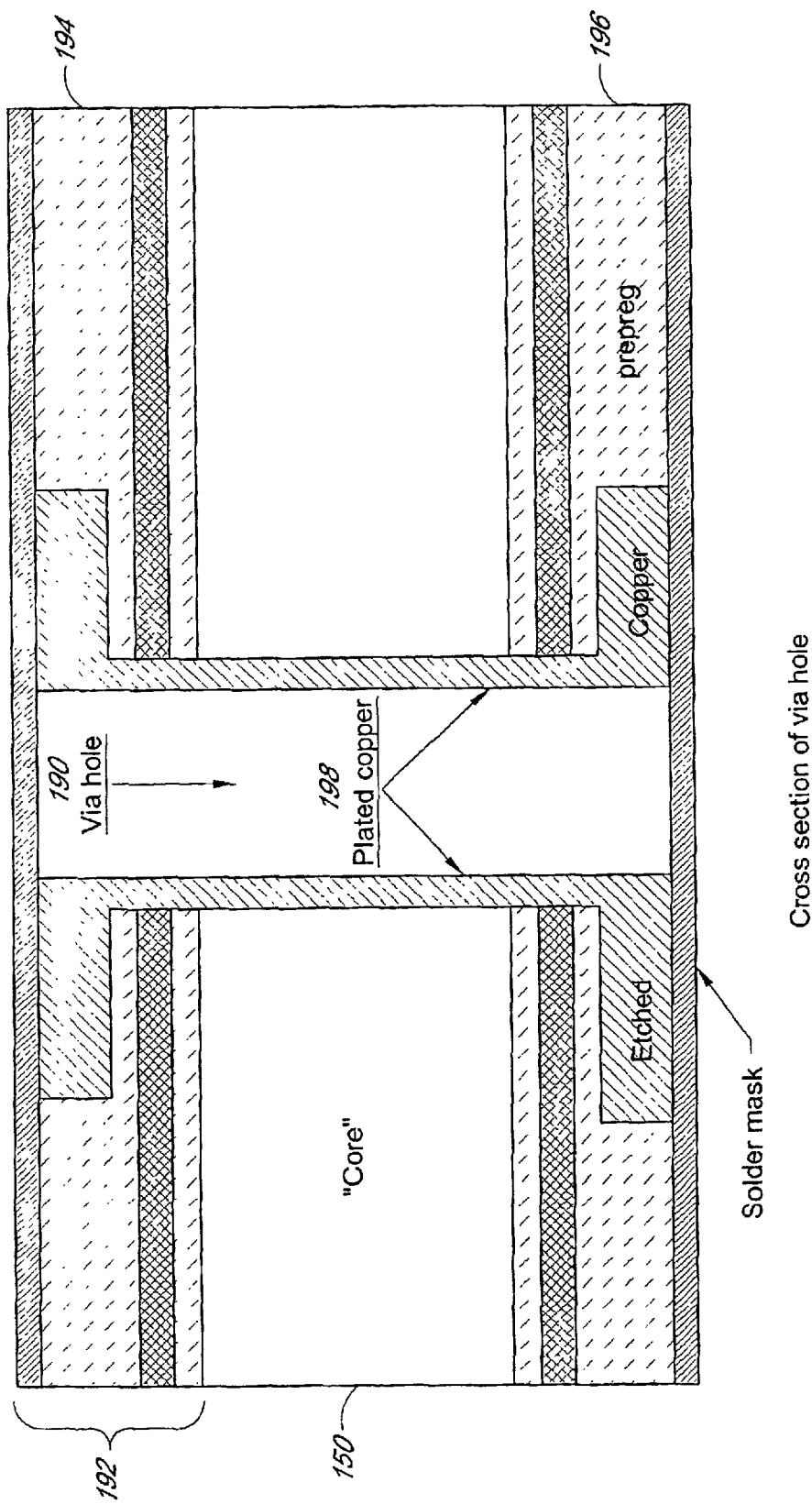
FIG. 10 an enlarged cross-section of a via hole in an individual ferromagnetic slab.

Another method of fabrication shown in FIGS. 8, 9, and 10 is to embed a multiplicity of ferromagnetic pieces 150, between the top 170 and bottom 172 layers of PCB circuits. FIG. 8 shows an array of holes 154 in a PCB adhesive, or prepreg array 156. This prepreg 156 panel is formed to accommodate each core piece 150. As shown in FIG. 9, after the pieces 150 are inserted into the holes 154 a top section 170 and a bottom section 172 of PCB are laminated to the array 156. The pieces 150 are thus contained by the lamination process which sandwiches the pieces 150 between two sheets of epoxy. Via holes 190 are formed through the composite layers of PCB 192, and pieces 150, to form a connection between the top PCB 194 circuitry and the bottom PCB 196 circuitry. Vias 190 filled with conductive inks 198 or standard industry plating processes are advantageously used to make the connection for a large number of cores simultaneously. The cross section of this construction is similar to the FLEX 117 construction shown in FIGS. 6 and 7. The major difference is due to the inflexibility of the PCB material, which does not conform to the individual pieces 150.

Fabrication without a FLEX or PCB

Figure 11:
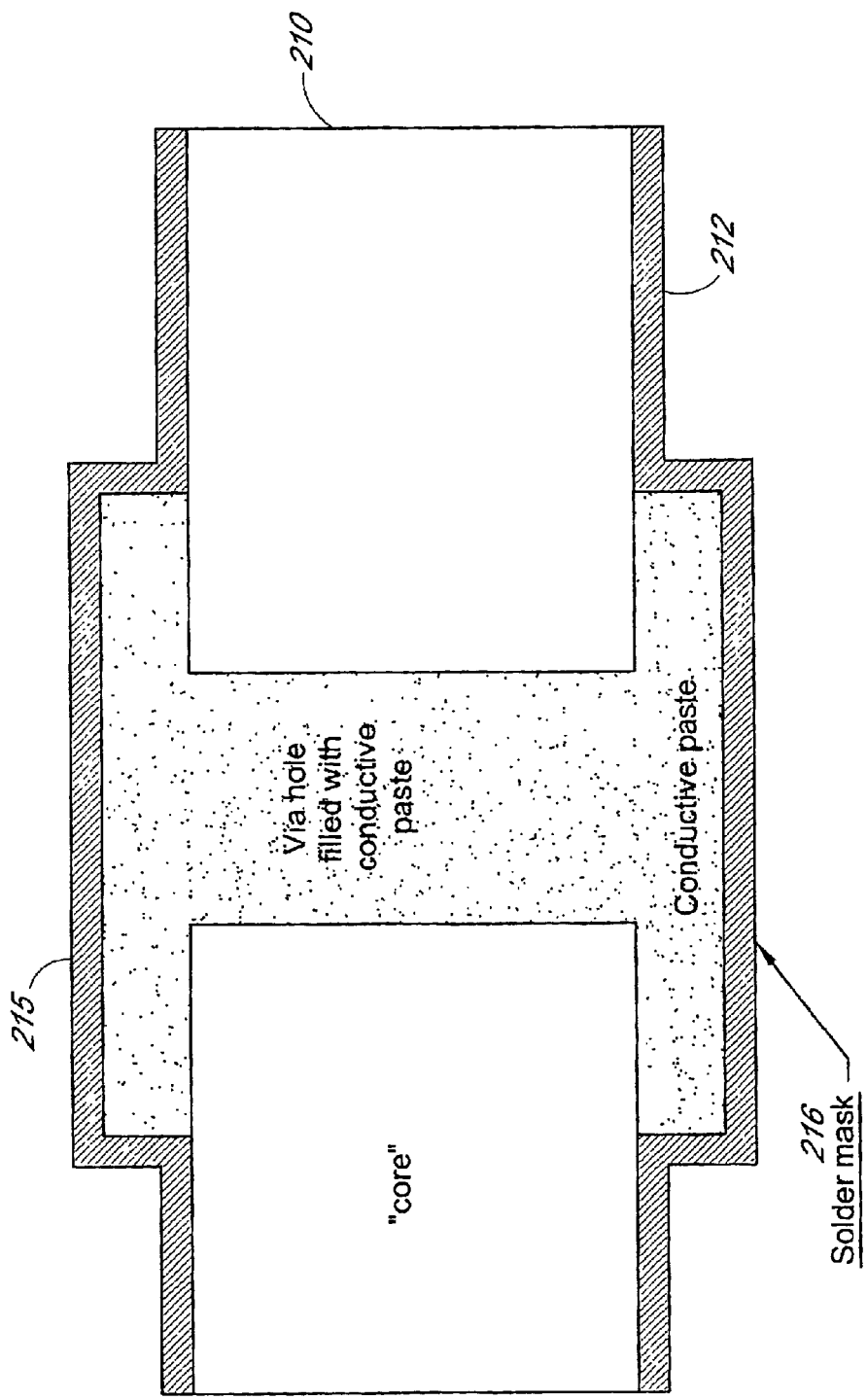
FIG. 11 is an enlarged cross-section of a via hole filled with screened conductive paste.

Another method of fabrication is shown in FIG. 11 in which a multiplicity of cores 210 are retained on a carrier 212. Each core 210 is molded with appropriate holes 214. Standard industry conductive ink screening processes are then used to form the circuits on the top 215 and bottom 216 of the cores 210 while simultaneously filling the holes 214 to make the required connection between the top 215 and bottom 216 sides.

Novel Employment of Ampere's Law

The embodiments of the invention described above, with conductive vias through the magnetic slab, employ Ampere's Law in a very novel manner. The vias are formed in such fashion as to allow a flux path to exist between two windings formed on the substrate. Thus, as shown in FIG. 3A, any enclosed path that falls within the inner vias 68 will encompass zero net current, therefore such paths will have no magnetic flux. Any path that encompasses the outer vias 56 will also encompass zero net current because the inner holes 68 have an equal but opposite current flow to the current flowing in the outer holes 56 creating zero magnetic flux in the region encompassing the outer vias 56. However, the enclosed paths between the inner and outer vias 68, 56 will have a net magnetic flux due to the enclosure of the inner vias 68. Other paths that partially enclose inner or outer vias 68, 56 will not have significant magnetic flux because the flux will select the shortest physical path, similar to electrical current. Thus, this configuration will behave very similar to the toroid of FIG. 2, and is shown as a virtual toroid 62.

It will be apparent that the proper selection of via holes enables many different shapes of virtual cores and arrangements of cores on substrates. Thus, many independent magnetic circuits can be constructed on the same substrate. Because of this, it is possible to construct more complex circuits than simple inductors and transformers by the appropriate placement of vias and circuit conductors on the top and bottom surfaces 52, 54 of the ferromagnetic slab 50 shown in FIG. 3. Using, for example, processes employed in conventional PCB and FLEX (flexible circuit boards) industries (photo-deposition, etching, and plating) multiple components such as resistors, capacitors and integrated circuits can be placed on the same substrate to form micro-miniature circuit assemblies.

Inductors and transformers useful for high frequency circuits such as are used for radio frequencies, typical ranges being 100 KHz to 100 MHz, can be constructed in accordance with the foregoing embodiments. The ferromagnetic slab 50 is advantageously formed of a thin layer of ferrite material having typical permeabilities in the range of 100 to 10,000 and resistivity in the range of 1,000 ohm/cm to $10^9$ ohm/cm. Typical ferrite compositions include ferric oxide and alnico. Such ferrite materials have a sufficiently high resistivity such that the plated vias through the slab are insulated one of the other. The transformers and inductors so constructed are adapted for miniaturization. They eliminate the need for complicated pins or lead-frames. Thus, a slab 1.5 inches long, 1 inch wide and 0.05 inches thick with 0.03 inch diameter vias can provide the core for two or more transformers. The ferromagnetic slabs may be very small. Surface pads on the top and bottom surfaces form the connections, and can be surface mounted directly to PCB's, thus reducing the footprint of the device and making more room for other components. The plotted windings are substantially in two parallel planes. Therefore the windings of a ten (10) layer planar transformer device, a typical application, can be reduced in overall height by a factor of five (5). The ferromagnetic slab may be very thin, e.g., 0.05 inches, so that the inductors and transformers of the invention may be constructed substantially in one very thin plane instead of a three-dimensional E core construction further reducing the overall height by a large factor.

Figure 13:
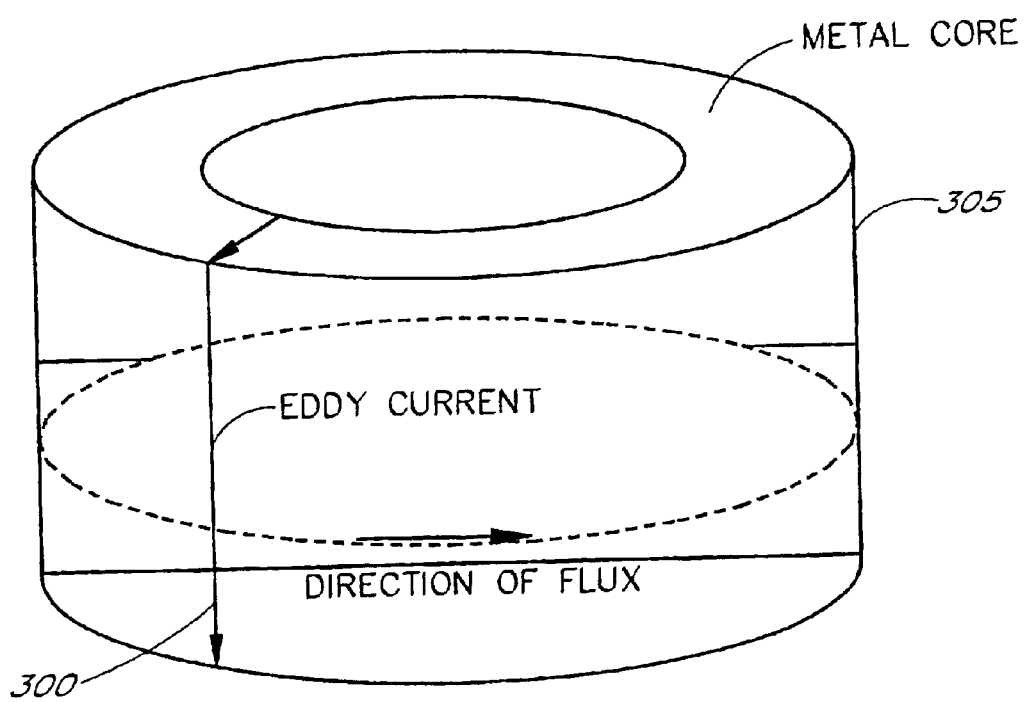
FIG. 13 shows a metal toroidal core illustrating the manner in which eddy currents are generated.

Further Preferred Embodiments of Transformer/Inductor Devices having High Flex Densities and Minimal Eddy Current Many inductive devices such as low frequency power transformers require cores having relatively high relative permeabilities typically in the range of 10,000 to 100,000. However, the improvements afforded by the preferred embodiments are applicable to lower and higher values, e.g., a range of 1,000 to 1,000,000. Certain metals and metal alloys provide these high flex densities including steel, iron, silica iron, 78 permalloy, Mumetal, purified iron, and supermalloy. Although these high flex densities can offer distinct advantages in constructing transformers and inductors, the low resistivity of the metals allow induced eddy currents to flow which counteract the benefits of the higher flux densities. The induced eddy currents 300 caused by the magnetic flux flowing in a metal core are illustrated in FIG. 13. Present day transformers/inductors that use metal as a core normally reduce these eddy currents by constructing the toroid or E core out of laminated metal E strips, with each strip separated by some type of dielectric bonding material. The entire E core contains many such strips to form the full core. By means of this configuration the eddy current is limited to the cross section area of each strip. As described below, a significant feature of this invention is to further reduce the core section areas.

The fabrication of one embodiment of this invention enabling use of ferromagnetic metal for the core material is illustrated in FIGS. 14-18 wherein a flex circuit or printed circuit board 290 supports a series of laminated thin metal annular rings formed on FLEX or PCB and separated by dielectric sheets. Plated via holes within the center and outside of the annular rings and plated complete the electrical turns around the core. As described below, this embodiment substantially minimizes eddy current by substantially reducing the cross sectional area of each laminated core section.

Figure 14:
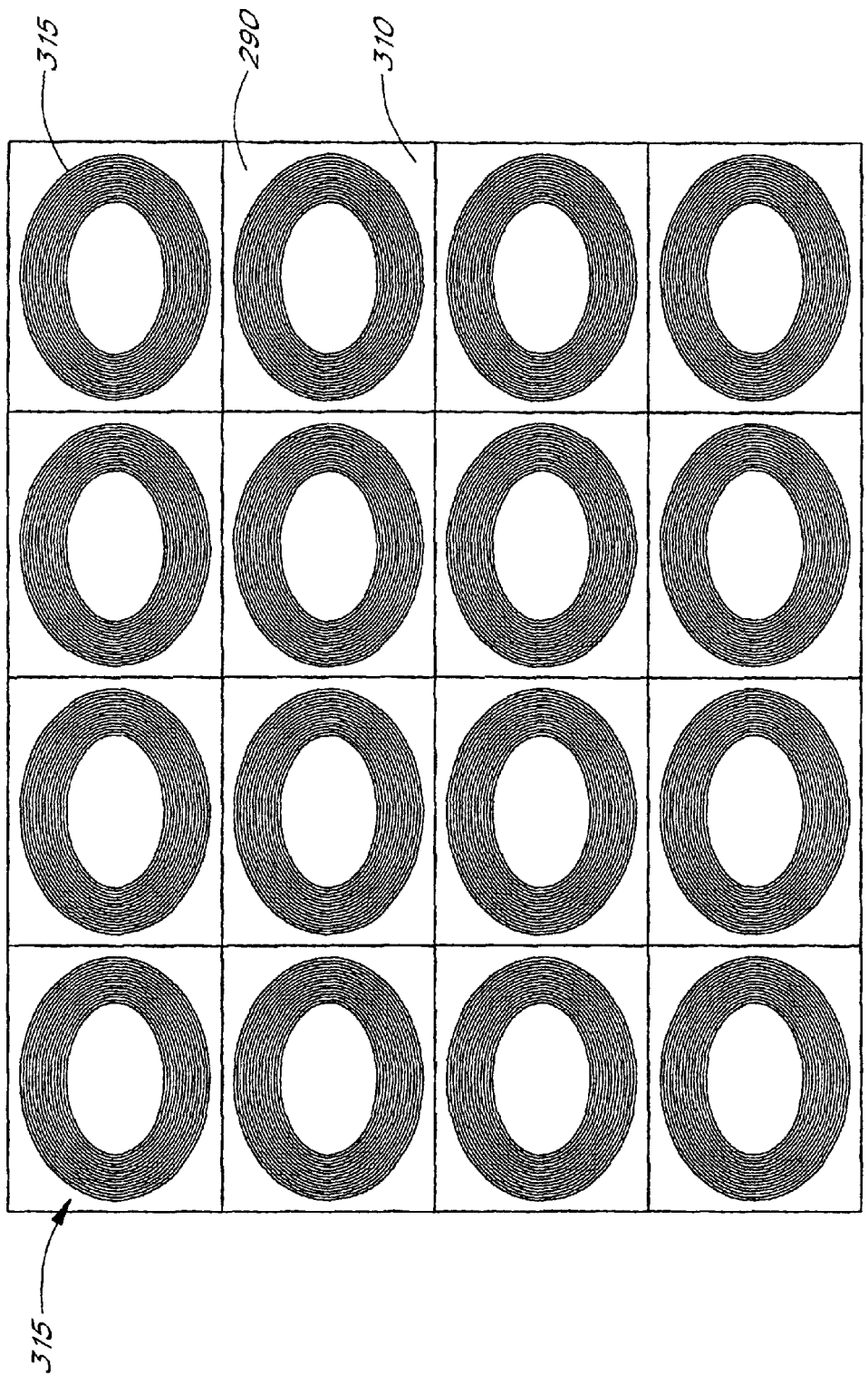
FIG. 14 illustrates a plurality of core laminations formed by etching concentric rings of ferromagnetic metal.

A plurality of core laminations are formed by first laminating the sheets of ferromagnetic metal to a PCB or FLEX 290 and then etching away portions of the ferromagnetic sheet to form a pattern of a plurality of closely spaced, narrow continuous core segments. Thus, FIG. 14 shows an individual layer of PCB or FLEX 310 with 16 etched core arrays. It will be understood that the lamination and etching processes known in the art will generally permit manufacture of more than 16 such arrays depending upon the size of the array and pattern. Advantageously, the core arrays 315 are etched using well known double-sided processes so that identical arrays are formed on both the top and bottom of sheet 310.

Figure 15:
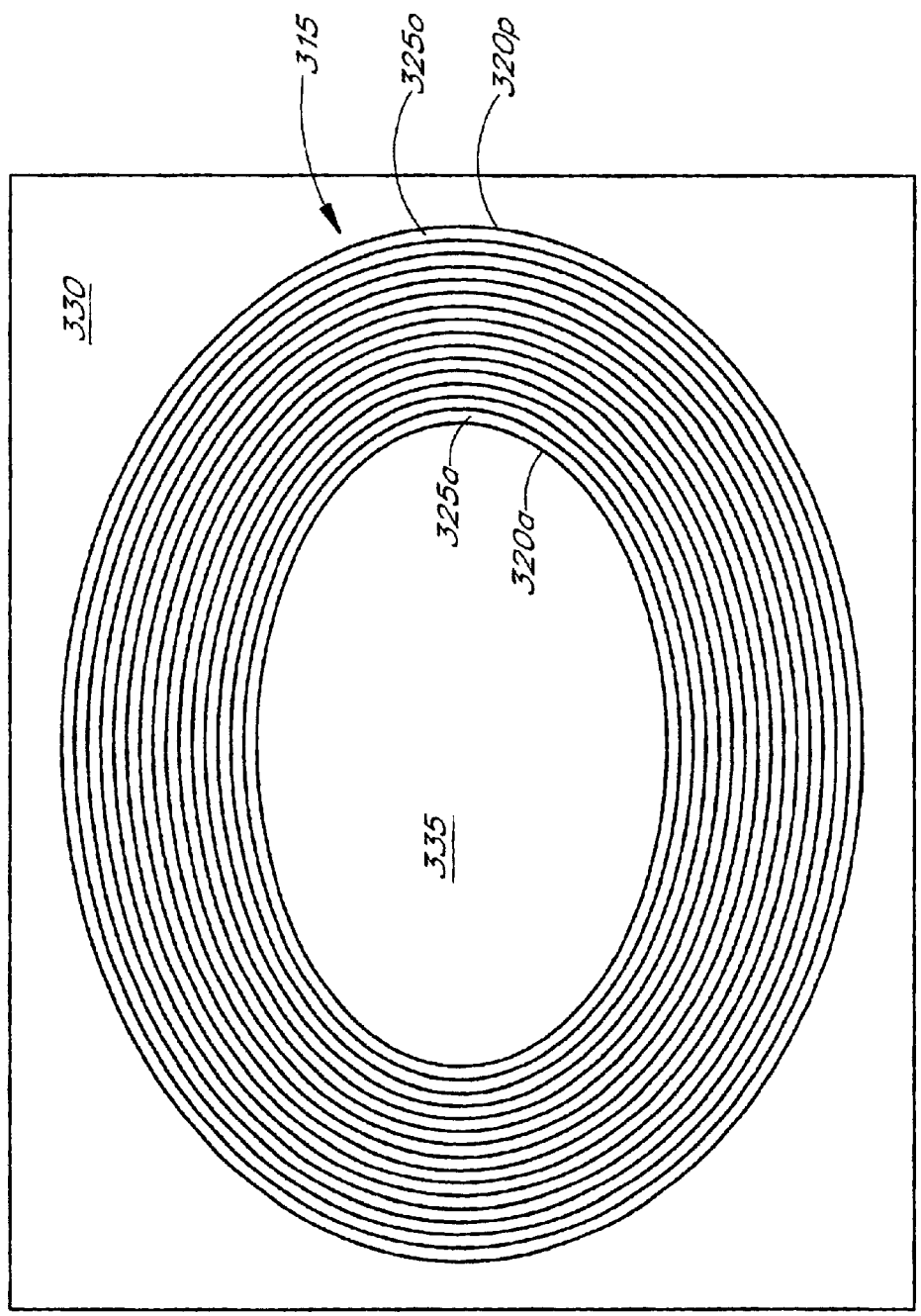
FIG. 15 is a is a enlarged view of one of the core laminations of FIG. 14.

An enlarged view of a single core array 315 is illustrated in FIG. 15 which shows an array having 16 concentric ferromagnetic electrically conductive metal rings 320a–320p insulated from each other by the respective etched out spaces or voids 325a–325o. Likewise, the area 330 outside the array 315 and the area 335 within the innermost ring 320 are void of magnetic material. This invention, however, is not limited to a concentric ring array and it will be apparent to those skilled in the art that other core arrays may be constructed such as a series of successively larger squares or rectangles insulated one from the other.

Figures 16A, 16B:
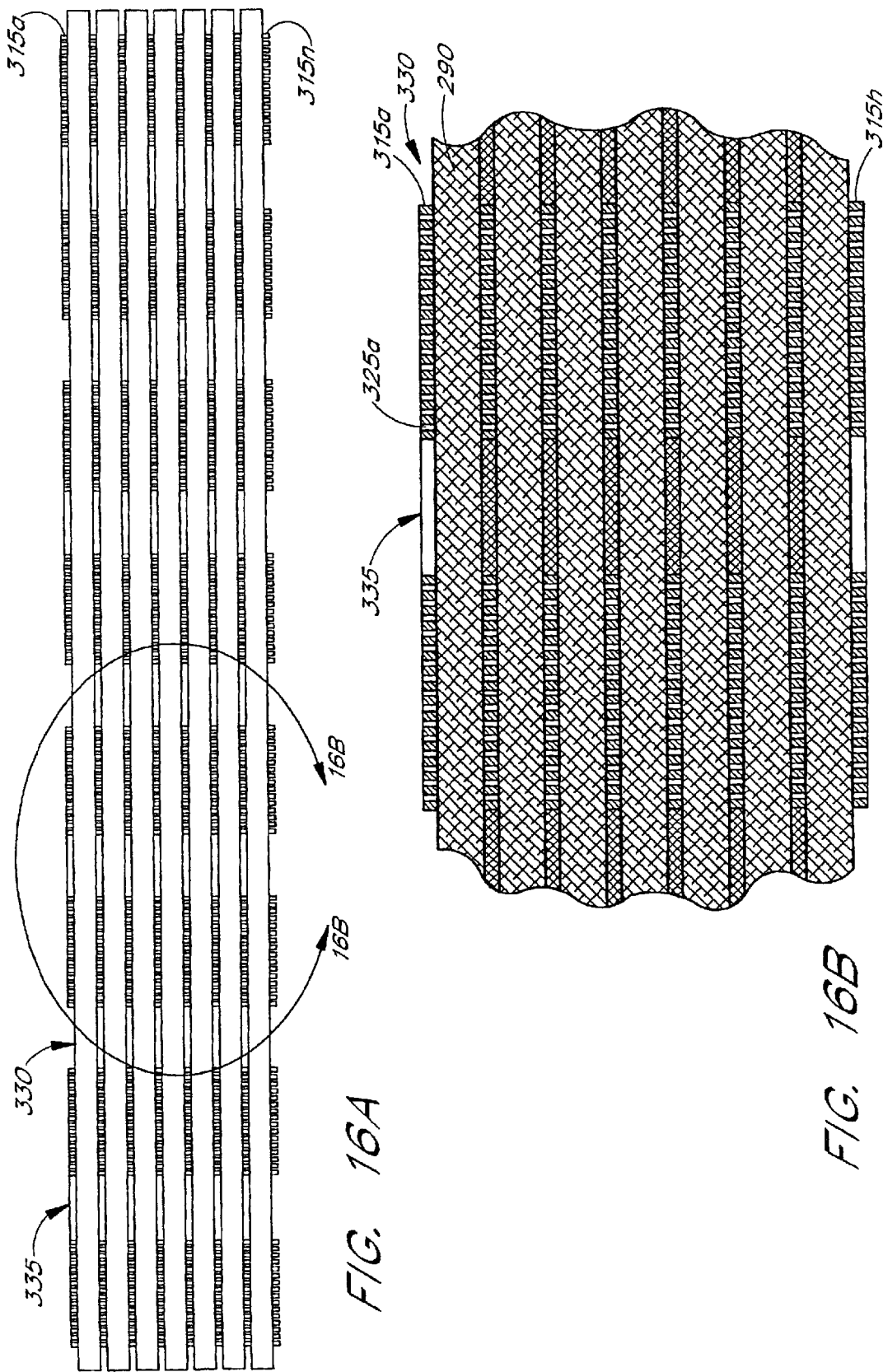
FIG. 16A is a is a cross-sectional view showing a plurality of stacked core laminations.
FIG. 16B is an enlarged view of one of the core stacks of FIG. 16A.

The next fabrication step is to stack a plurality of the PCB and FLEX layers 310 with the arrays 315 substantially in alignment. As shown in FIG. 16A, core arrays of concentric rings 315a–315h are stacked one on top of each other with the core patterns on each layer in alignment. The result is the fabrication of a plurality of high flux carrying metal cores having very small eddy current areas. Thus, the thickness of the original sheet used to etch the arrays 315 can be very thin, typically in the range of 0.0005" to 0.010" inches. The concentric rings can be etched using conventional PCB or FLEX (FPC) etching techniques to very narrow widths on the order of 0.002" to 0.003". As a result, referring to the cross-sectional eddy current producing areas of the core are very drastically reduced in size.

As part of the stacking process, a thin layer of dielectric material 340 is placed adjacent to the top surface of each etched concentric ring array 315. Typically, an epoxy material is used. This dielectric sheet and the dielectric sheet supporting the etched ferromagnetic rings may be of different materials. Representative materials include epoxies and acrylics manufactured by Dupont and Rogers Corp. for manufacturing of PCB boards and FLEX. Epoxies and prepregs (and epoxies with glass) are generally used to construct PCB boards and acrylics are generally used to manufacture FLEX. During the laminating process, the voids 325, voids 330 and voids 335 shown in FIG. 15 are filled with dielectric material 340 shown in FIGS. 18A and 18B.

As described above, the electrical windings of the preferred embodiments of this invention are advantageously provided by conductive through hole vias in contact with printed circuitry on both sides of the core structures. The fabrication steps for windings of the embodiments of FIGS. 14-18 is shown in FIGS. 17A, 17B, 18A and 18B.

Figures 17A, 17B:
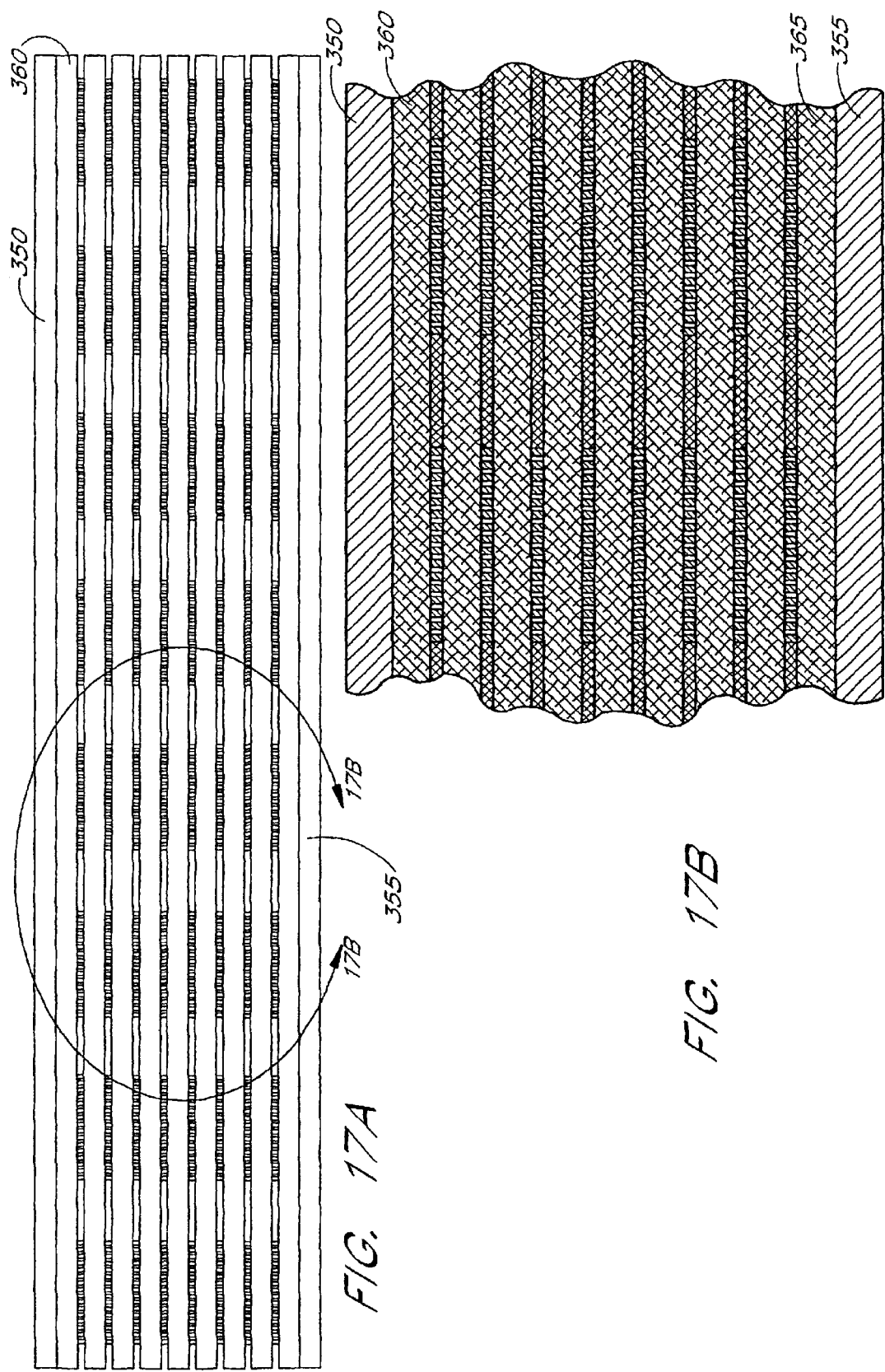
FIG. 17A is a cross-sectional view showing the stack of FIG. 16A after the top and bottom printed circuits have been added.
FIG. 17B is an enlarged view of one of the core stacks of FIG. 17A.

Referring to FIGS. 17A and 17B, additional layers of copper 350, 355 are respectively laminated on the top and bottom surfaces along with two additional layers of dielectrics 360, 365 separating the copper surfaces from the etched metal surfaces.

The completed structure is illustrated in FIGS. 18A and 18B with via holes 370 drilled through the entire laminated array. These vias are located proximate to, but typically not in contact with the low resistivity ferromagnetic rings so as to electrically insulate the windings turns provided by the plated vias. These holes 370 are then plated with a electrically conductive material, typically copper. Conductive inks and conductive pastes within the via holes may also be employed. The copper layers 350, 355 are then etched to form circuit patterns in electrical contact with the plated through holes 370 for forming windings around the concentric ring core arrays 315.

The embodiment shown in FIGS. 18A and 18B illustrates, for simplicity of illustration, a small number of via holes 370a, 370b, 370c and 370d for each transformer. It will be apparent to those skilled in this art that the embodiments of FIGS. 14-18 can have multiple windings by adding additional through holes. If necessary, additional copper layers may be stacked on layers 350, 355 to provide the requisite connections to additional through holes.

Individual transformers and inductor devices are extracted from the laminated array of FIGS. 18A, 18B by the usual methods of "die" cutting or routing the parts from the array. Each such device can be used as a replacement for the traditional inductive devices shown in FIGS. 1 and 13. Also, because the etched metal core is part of an array such as shown in FIG. 16, it can be interconnected to other components.

Figure 1:
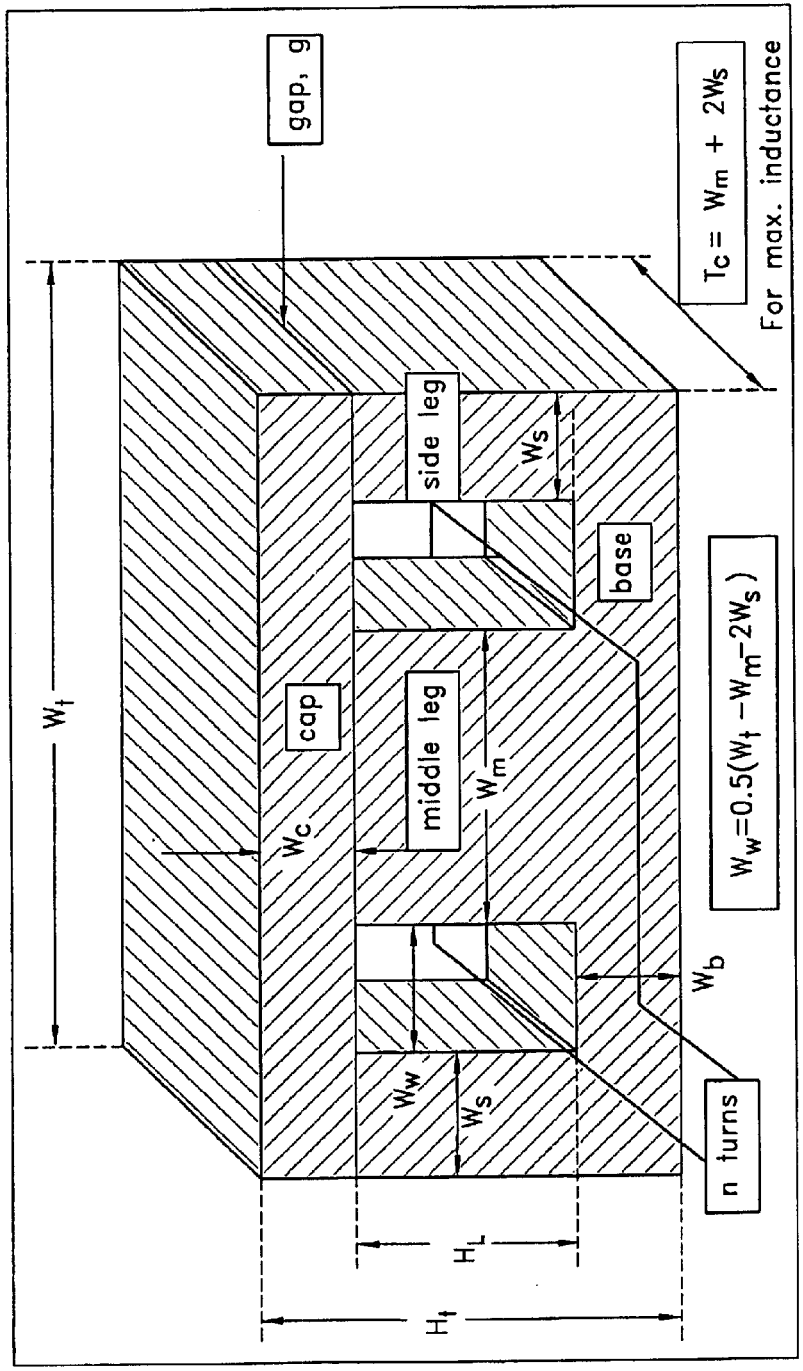
FIG. 1 is a conceptual illustration of a prior art ferromagnetic E core, with a matching ferromagnetic cap.

The Advantages of the Preferred Embodiments One Piece Core:

In E core construction, as shown in FIG. 1, a gap forms between the E core and the cap which can not be avoided. Most transformers use an E type core that requires one half of the core be joined to the other using, for example, epoxies and clamps. These processes are time-consuming, introduce losses, and cause variances in the parameters of the devices due to the resulting gap between the E core and the cap. In contrast, the cores of the preferred embodiments of this invention are a continuous piece, thereby providing improving transformer efficiency. The one-piece design also eliminates the need to join two separate pieces together in a separate processing step.

If an intentional gap is desired in the embodiments of FIGS. 14-18 to avoid magnetic saturation, a separation can be etched in each of the concentric rings shown in FIG. 15. Such etched gap rings eliminate the large variations of the traditional mechanical separation of the E cores.

Reduction of Eddy Currents:

Inductors and transformers constructed in the manner of FIGS. 14-18 offer superior performance with much less eddy current by segregating the metal lamination in two directions. This results because the preferred embodiment shown has a core which is both thinner than conventional laminated cores by virtue of the fact (a) that the sheets of metal, from which the rings 320 are etched, can be much thinner using PCB or FLEX fabrication materials and (b) the individual insulated rings 320 may be made very narrow. Since eddy currents are proportional to the square of the segment cross section area, the preferred embodiments dramatically reduce eddy currents compared to traditional methods of making transformers or inductors. For example, referring to traditional E core shown in FIG. 1, the metal laminates of this core cannot be separated in two directions because the strips would fall apart or simply not have mechanical integrity.

Surface Mount:

Windings formed in accordance with the preferred embodiments can be formed into surface mount leads without the need for separate lead-frame constructions, complicated pinning or end plating.

Interconnection:

Because the etched transformers/inductors are manufactured employing identical processes used to manufacture PCB's or FPC's, the transformers can advantageously be an integral part of the power supply or circuit assembly thereby reducing the physical size, reducing the connections, and, in general, making the assembly more compact and smaller. Circuit components can be placed directly above or below the etched transformer, using the transformer area as the carrier for the balance of the circuitry so that the area of the entire circuit would be as small as the area of the transformer.

Magnetically Sound:

Cores constructed in accordance with the preferred embodiments offer a more efficient flux path with fewer losses than traditional transformers. These characteristics more closely resemble a toroid in design and function. The magnetic flux path is shorter than comparable transformers using traditional cores such as E-Cores and PQ Cores.

Size:

The preferred embodiments can be made smaller because they do not require complicated pins or lead-frames. Surface pads on the top and bottom surfaces form the connection themselves and they can be surface mounted directly to PCB's thus reducing the footprint of the device and making more room for other components. Windings are in 2 planes therefore the windings of a ten-(10) layer planar transformer device, a typical application, can be reduced in overall height by a factor of five (5). The "core" is in one plane instead of a three-dimensional E core construction further reducing the overall height by a large factor.

Cost:

The preferred embodiments can be made from flex circuits and much less expensive to manufacture than multi-layer planar windings. Also eliminating and the need for lead-frame's, potting, and cap gluing thus making the device easier to manufacture.

Figure 12:
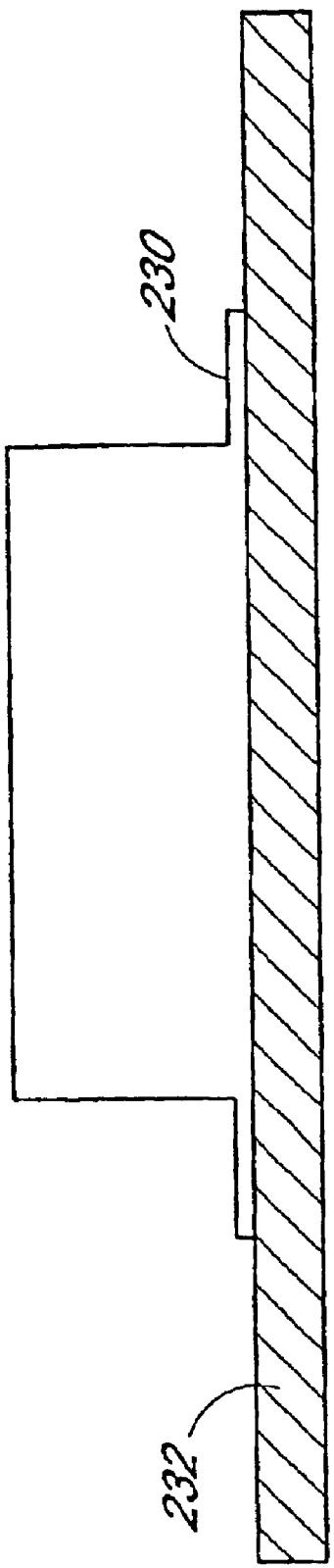
FIG. 12 illustrates the invention's heat dissipation characteristic by improved surface area to volume ratio.

Heat Removal:

A significant feature of inductors and transformers constructed in accordance with the preferred embodiments of the invention is that the heat generating windings of are not buried within an assembly or wound on top of each other as in traditional transformers nor are they stacked together as in planar transformers. Instead, the plated windings substantially reside on the top and bottom planes of the transformer or inductor device. This layout offers superior heat dissipation with no trapped heat buried within windings. The PCB can be advantageously attached to a heat sink, separated only by a thin solder mask typically only 0.005 inches thick, placing half of the windings in thermal contact with the heat sink, thereby offering a superior surface area to heat ratio. FIG. 12 shows one example of a large surface area 230 for excellent heat removal directly mounted to a heat sink 232 such as copper and aluminum.

While the invention has been described herein with reference to certain preferred embodiments, these embodiments have been presented by way of example only, and not to limit the scope of the invention. Accordingly, the scope of the invention should be defined only in accordance with the claims that follow.

What is claimed is:

1. A method for making a miniature inductor/transformer having minimal eddy current effects comprising:
    etching a thin sheet of ferromagnetic metal to form at least a plural array of concentric narrow rings of said ferromagnetic metal, the rings extending in a first direction;
    stacking a plurality of said arrays separated by a dielectric material to form a plurality of cores stacked in a second direction perpendicular to the first direction, said cores so constructed having a very small cross-sectional area defined by the thickness of the sheet of ferromagnetic material and the width of said concentric narrow rings so as to minimize the eddy current effect;
    laminating said stack of arrays between copper sheets;
    forming said copper sheets into printed circuits;
    forming vias through said printed circuits proximate said laminated ferromagnetic arrays; and
    plating said vias in electrical contact with said printed circuitry to form electrical windings.

2. A method for making a miniature inductor/transformer comprising:
    forming a thin layer of a ferromagnetic on a thin sheet of insulating material;
    etching said thin layer to form a series of thin discrete continuous ferromagnetic members extending in a first direction;
    forming a first thin sheet having a printed electrical circuit thereon;
    forming a second thin sheet having a printed circuit thereon;
    stacking, in a second direction perpendicular to the first direction, a plurality of said sheets having said etched ferromagnetic material members between said first and second thin sheets;
    forming through holes through said laminated sheets; and
    plating electrically conductive material within said through holes in electrical contact with said printed circuitry on said first and second thin sheets, said conductive through holes providing a portion of an electrical winding of the inductor/transformer.

3. The method of claim 2, wherein said sheets are printed circuit boards.

4. The method of claim 2 wherein said sheets are flex circuits.

5. The method of claim 2, wherein said continuous ferromagnetic members are a series of discrete concentric rings having successfully larger diameters.

6. The method of claim 2, wherein said thin discrete continuous members are a series of similar successively larger geometric configurations.

7. The method of claim 2, wherein said thin discrete continuous ferromagnetic members have a thickness in the range of about 0.0005 inches to 0.010 inches.

8. The method of claim 7, wherein said thin discrete continuous ferromagnetic members have an etched width of about 0.002 inches to 0.003 inches.

9. A method for making a miniature inductor/transformer comprising:
    forming a thin layer of ferromagnetic on a thin sheet of insulating material;
    forming a first thin sheet having a printed circuit thereon;
    forming a second thin sheet having a printed circuit thereon;
    etching said thin layer to form a series of discrete continuous ferromagnetic members extending in a first direction;
    laminating, in a second direction perpendicular to said first direction, a plurality of said sheets having said etched layers of ferromagnetic material between first and second thin sheets;
    forming through holes through said laminated sheets; and
    plating electrically conductive material within said through holes in electrical contact with said printed circuitry on said first and second thin sheets, said conductive through holes providing a portion of an electrical winding of the inductor/transformer.

10. The method of claim 9, wherein said sheets are printed circuit boards.

11. The method of claim 9, wherein said sheets are flex circuits.

* * * * *